United States Patent [19]

Greer

[11] Patent Number: 5,468,655
[45] Date of Patent: Nov. 21, 1995

[54] METHOD FOR FORMING A TEMPORARY ATTACHMENT BETWEEN A SEMICONDUCTOR DIE AND A SUBSTRATE USING A METAL PASTE COMPRISING SPHERICAL MODULES

[75] Inventor: Stuart E. Greer, Austin, Tex.

[73] Assignee: Motorola, Inc., Schaumburg, Ill.

[21] Appl. No.: 332,311

[22] Filed: Oct. 31, 1994

[51] Int. Cl.⁶ .................... H01L 21/283; H01L 21/58; H01L 21/60; H01L 21/66
[52] U.S. Cl. .................... 437/8; 437/183; 437/209; 228/180.22; 257/738
[58] Field of Search .................... 437/8, 183, 209; 257/738, 746, 772, 779; 228/180.22

[56] References Cited

U.S. PATENT DOCUMENTS

| 5,108,027 | 4/1992 | Warner et al. | 228/254 |
| 5,133,495 | 7/1992 | Angulas et al. | 228/180.1 |
| 5,147,084 | 9/1992 | Behun et al. | 228/56.3 |
| 5,208,186 | 5/1993 | Mathew | 437/183 |
| 5,269,453 | 12/1993 | Melton et al. | 228/180.22 |

FOREIGN PATENT DOCUMENTS

| 562981 | 3/1993 | Japan | 437/183 |
| 5144877 | 6/1993 | Japan | 437/212 |
| 5211149 | 8/1993 | Japan | 437/183 |

Primary Examiner—Olik Chaudhuri
Assistant Examiner—David E. Graybill
Attorney, Agent, or Firm—Minh-Hien N. Clark

[57] ABSTRACT

A nodular metal paste (42) is used to temporarily attach the bumps (34) on a semiconductor die (32) to a substrate (38). The spherical nodules (44) composing the metal paste are dispensed onto contact pads (40) on the substrate, and then heated until they partially melt. The partial liquid region permits bonding of the individual metal nodules to the contact pads and to adjacent nodules. Subsequently, a bumped die is placed over the nodules and heated to a minimum temperature required to partially remelt to form a local tack joint. Because the metallurgical contact area between the paste nodules and the bumps is minimized, electrical contact can be sustained with a small cross-sectional area of connected material to create an electrically sound but physically weak link between die and the substrate. Once connected to the substrate, the die may be tested and burned-in, and removed afterwards with little damage to the bumps.

20 Claims, 4 Drawing Sheets

METHOD FOR FORMING A TEMPORARY ATTACHMENT BETWEEN A SEMICONDUCTOR DIE AND A SUBSTRATE USING A METAL PASTE COMPRISING SPHERICAL MODULES

CROSS-REFERENCE TO RELATED APPLICATION

Related subject matter is disclosed in a pending U.S. patent application Ser. No. 08/236,320 by Stuart E. Greet entitled "Semiconductor Device Solder Bump Having Intrinsic Potential for Forming an Extended Eutectic Region and Method for Making and Using the Same," filed on May 2, 1994 and commonly assigned to assignee hereof.

1. Field of the Invention

The present invention generally relates to solder attachment of a semiconductor die, and more specifically to a temporary attachment for easy subsequent detachment.

2. Background of the Invention

Testing and burn-in of a controlled chip collapse connection (C4) semiconductor die produces a "known good die" (KGD) which is rapidly becoming a high demand item in the semiconductor industry for flip-chip and multichip module applications. For the purposes of test and burn-in of C4 dice, it is often necessary to temporarily attach the solder bumped dice to test substrate carriers. Because of the unique nature of the solder bumps, one must select an interconnection methodology that does not alter the bump structure during the test and burn-in evaluation. It is also important not to alter the nature of the $C_4$ bumps on the semiconductor die after those test and burn-in evaluations because these bumps are then subsequently reflowed to permanently attach the KGD to the next level interconnect. An additional constraint on test and burn-in methods is the required easy separation of the C4 semiconductor die from the test substrate to avoid destroying the solder bumps on the die after the evaluations. This constraint precludes the use of permanent or semi-permanent links that result from high temperature metallurgical interconnection techniques. Moreover, the choice of interconnect metallurgies must be such that detrimental contaminants are not transferred to the bump from the substrate or become an integral part of the bump as a result of the attachment and detachment processes.

Currently, physical methods, such as piercing or abrasive connections, are commonly used to link the C4 solder bumps to the test substrate. Piercing connections involve needle-like probes on the substrate that pierce into the bumps to make the physical contact between the substrate and the die. Abrasive connections on the other hand involve rubbing the bumps against roughened or texturized surfaces on the substrate in order to make multiple mating mini contacts between the die and the substrate. Positive spring forces are often applied between the bump and the substrate to help maintain physical contact. However, since the solder bumps become extremely soft during high temperature burn-in, there is difficulty in retaining electrical continuity even when positive spring forces are applied. Moreover, there is a tendency for the solder bumps to become flattened as a result of these physical methods, which is an undesirable consequence of testing. Often these solder bumps must undergo a high temperature (350° C.–360° C.) reflow process after test and burn-in to reshape the bumps into the characteristic rounded shape that end users expect. This additional processing can be detrimental to the die. Furthermore, if the bumps are severely damages or deformed, they may not recover their shape even at these reflow temperatures. Moreover, cycle time is increased as well as cost. Thus, these physical methods are inefficient or inadequate for reliable testing purposes since the critical positive electrical contact during all phases of the test and burn-in evaluation cannot be guaranteed.

DETAILED DESCRIPTION OF A PREFERRED EMBODIMENT

The present invention describes a method of selectively forming nodular protrusions on substrate interconnections using metal pastes fabricated of the same metals as contained in the bumps present on the C4 semiconductor chips. The nodules are uniquely formed on the wettable portion of the substrate fingers or contact pads by dispensing the metal paste onto the fingers, and then heating the nodules to a predetermined temperature where they only partially melt. The partial liquid region permits bonding of the individual metal nodules to the contact pads and to adjacent paste nodules. This partial bonding allows the metal nodules to still protrude above the substrate contact pad. Different solder compositions and heating temperatures can provide optimum combinations of protrusion height and wetting of the metal paste to the substrate. A bumped semiconductor die can then be temporarily attached to the partially bonded nodules through what is effectively a tack joint.

Generally solder bumped semiconductor dice are placed over the partially bonded nodules and heated to a minimum temperature required to partially remelt and locally join to the bumps. Because the metallurgical contact area between the paste nodules and the chip bumps is minimized, electrical contact can be sustained with only a small cross-sectional area of connected material. This tack joint creates an electrically sound but physically weak link between die and the substrate. Once connected to the substrate, the dice may be tested and burned-in according to specification. After test and burn-in are completed, the dice can be removed with little residual damage to the bumps themselves.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
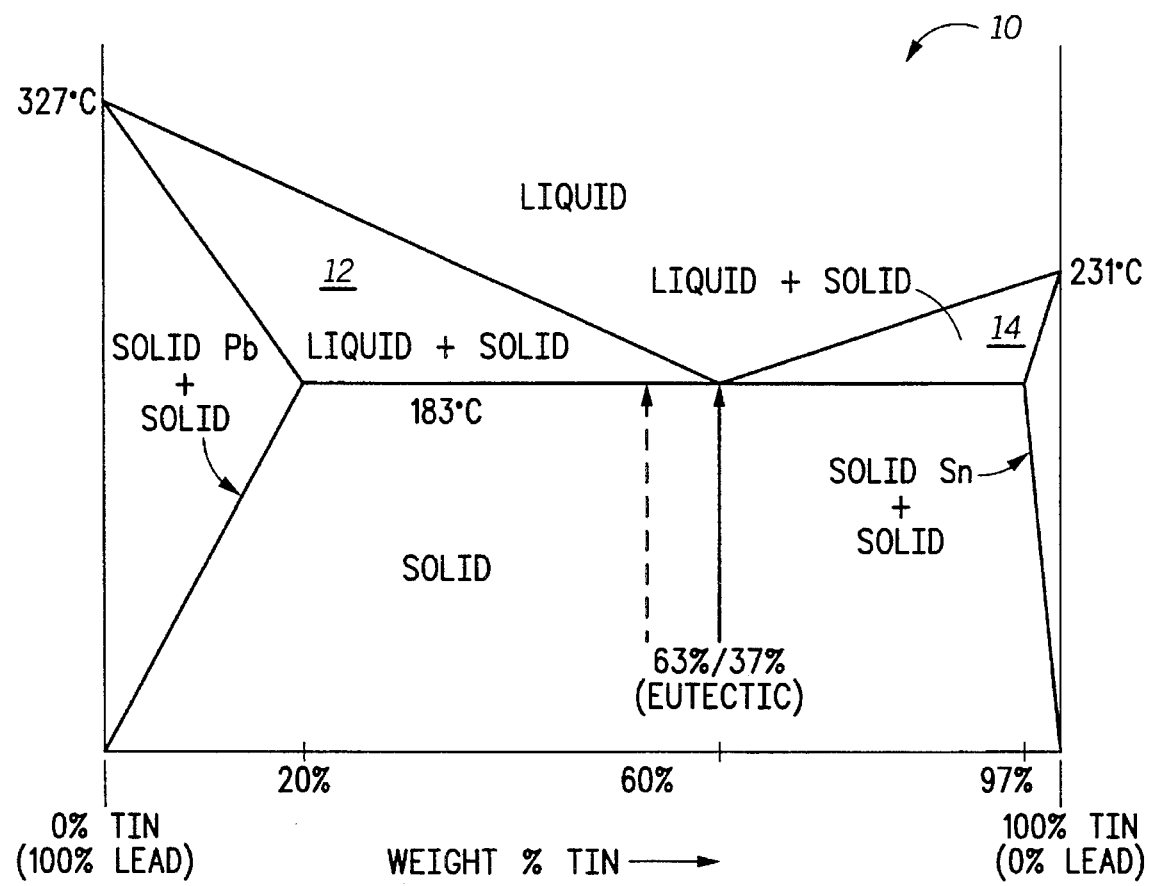
FIG. 1 is a lead-tin phase diagram illustrating the different solidus and liquidus regions as a function of temperature and weight percent tin.

What follows is a method for forming a temporary attachment between a solder bump on a semiconductor die and a nodular metallic paste pre-placed on a metallic contact pad on a substrate. FIG. 1 is a metallurgical phase diagram 10 for lead-tin alloys. Phase diagram 10 illustrates the different solidus and liquidus regions of the alloy as a function of temperature and weight percent (wt. %) tin. When an alloy of approximately 63 wt. % tin is heated from room temperature to approximately 183° C., a eutectic (lowest melting) liquid is formed. This phase transition from solid to liquid is utilized to practice one embodiment of the present invention as will be discussed later. One can choose a starting material of this composition as the metal paste placed on a substrate. However, the invention is in no way limited to the use of a eutectic lead-tin solder. Other starting alloys, specifically those between 20 wt. % tin and 97 wt. % tin can offer more flexibility in the nodule formation and nodule attach steps since they form partially solid/partially liquid "2-phase" regions above 183° C. This 2-phase region means that they will retain their spherical structure over a significant span of temperatures above 183° C., whereas the eutectic material will become fully liquidized and melted above 183° C. Hence, non-eutectic alloys may be more robust, allowing a wider process window, in this application since retention of the substantially spherical shape of the partially melted nodules is important. Additionally, other metal alloy pastes may also be used in practicing the invention to achieve the same results.

Figure 2:
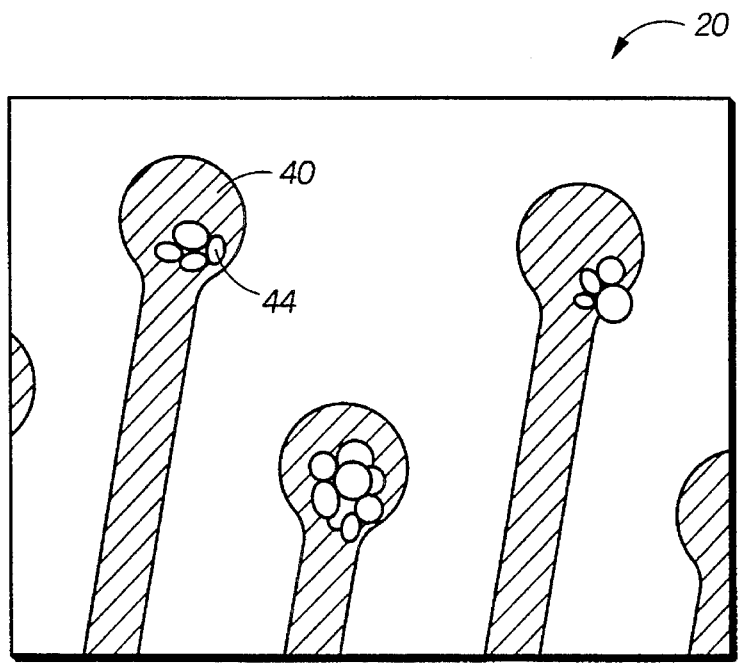
FIG. 2 is a magnified photograph of a portion of a substrate having a conductive trace terminating in a contact pad with a metal paste thereon, in a first step in practicing an embodiment of the invention.

In accordance with the invention, a metal paste is first placed onto contact areas on a carrier substrate. FIG. 2 is a magnified photograph 20 of a portion of a carrier substrate having conductive traces with a metal paste on contact pads. The conductive traces and contact pads or fingers are wettable portions, typically composed of copper, plated copper or nickel-gold. A metal paste, preferably lead-tin solder or another suitable metal alloy, has been dispensed onto the contact pads or fingers. The amount of paste dispensed can vary. As can be seen, the paste is composed of substantially spherical nodules. It is important to ensure that the size of the nodules composing the metal paste is chosen so that a minimum number of nodules are left on the substrate finger or contact pad. At least 1 nodule must be dispensed on the finger for the invention method to work. However, covering the entire finger with metallic nodules is also feasible. The metal paste is typically applied through a metal mask that is pre-aligned to the finger area of the substrate, though other methods can be used to place the metal paste such as automated micro-dispensers or syringes. Once the paste material is dispensed, the substrate is heated to an optimum temperature where the nodules begin to coalesce and wet to the substrate fingers, but without collapsing into a single fused droplet of solder on the substrate finger. Hence, the individual nodules retain their substantially spherical shape after partial joining. This optimum temperature is a function of the starting paste alloy material. For a eutectic solder, this temperature is approximately 183° C., although in a given process, ±2° C. is common. For solders having 20 wt. % tin to less than 63 wt. % tin (eutectic), the process window is much wider, meaning that the temperature can be much higher than 183° C. for the partial joining.

This phenomenon can best be explained by referring to the phase diagram 10 in FIG. 1, where the liquid+solid region 12 is the operating region for the partial joining process. The operating window can be anywhere between 183° C. and approximately 250° C. for a 20 wt. % tin solder. The operating window narrows as more tin is added to the solder until the eutectic solder is fairly confined to the 183° C.±2° C. window mentioned above. Moving across the diagram to the next liquid+solid phase region 14, one can see that again the operating window widens to the maximum workable solder having 97 wt. % tin which would have an operating window between 183° C. and approximately 225° C.

One advantage to the preceeding processing steps is that once the paste nodules are partially bonded together and wetted to the contact pads or fingers on the substrate, the substrate may be stored for an extended period of time before it is used or the substrate may be used immediately for chip attach as discussed below.

Figure 3:
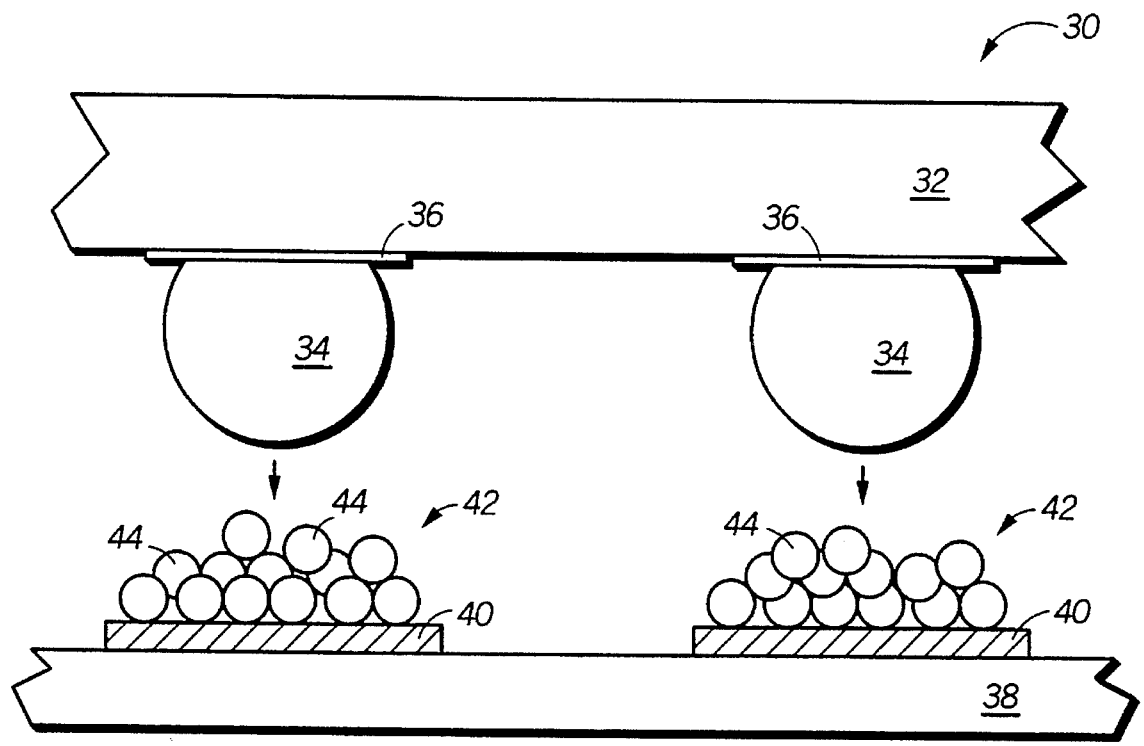
FIG. 3 illustrates, in a cross-sectional view, a semiconductor die having interconnect protrusions on an active surface which are aligned to the contact pads of the substrate, in a subsequent step of practicing the invention.
Figure 4:
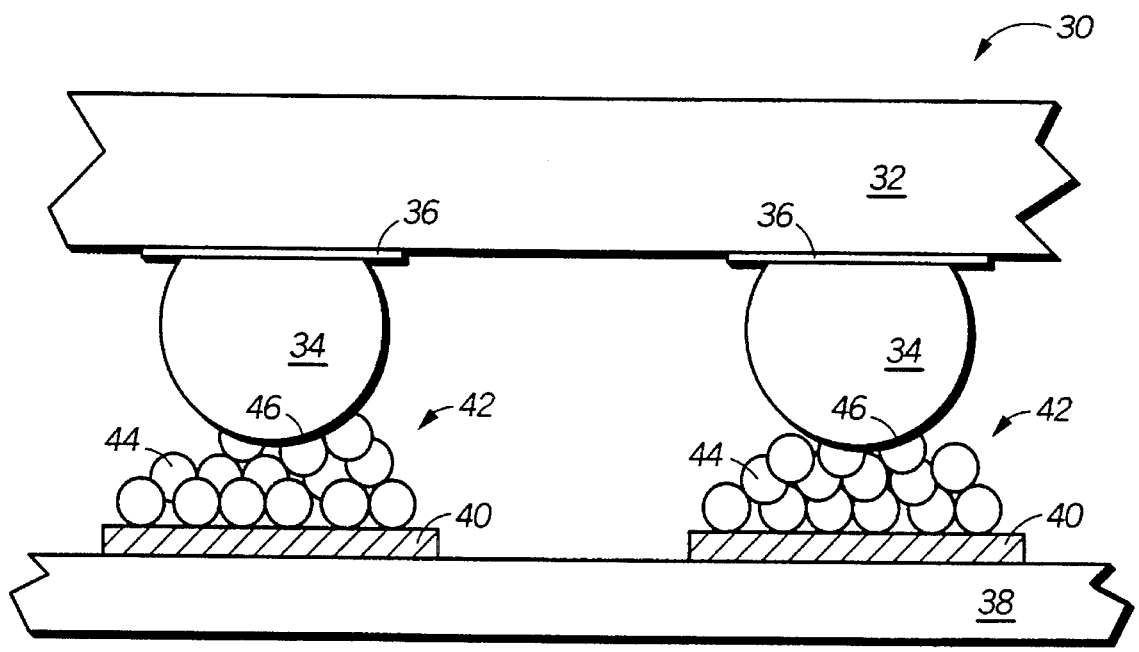
FIG. 4 illustrates, in a cross-sectional view, a temporary attachment between the semiconductor die and the substrate, in a subsequent step of practicing the invention.
Figure 5:
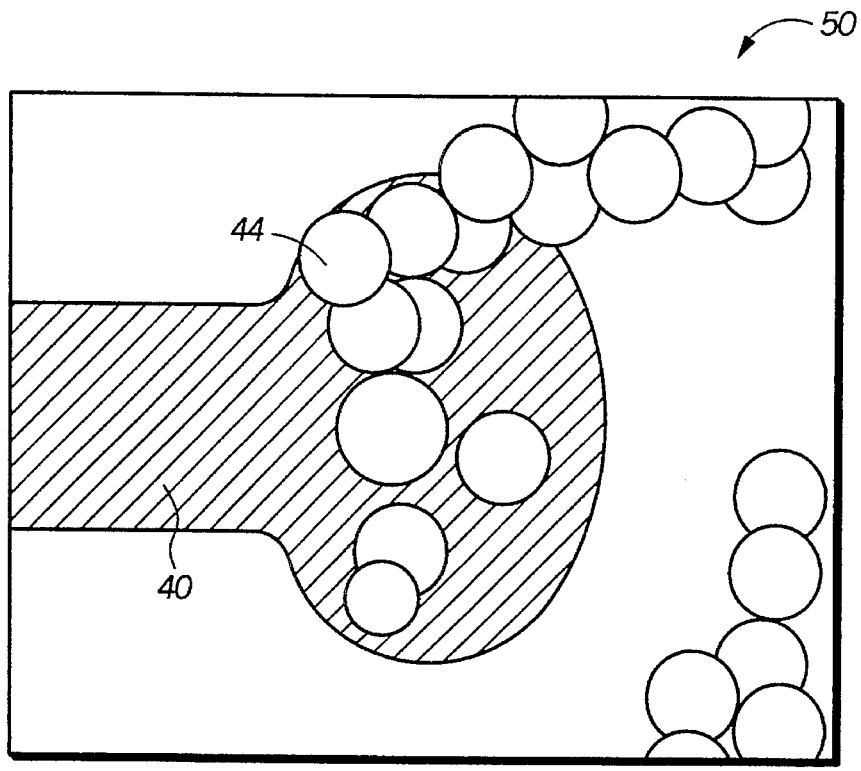
FIG. 5 is a scanning electron microscope (SEM) micrograph of a contact pad having spherical solder nodules which have been partially fused together, in an experiment using the method of the invention.

FIGS. 3–4 illustrate, in cross-sectional view, the subsequent steps in practicing the invention. FIG. 3 illustrates a semiconductor die 32 having interconnect protrusions 34 on an active surface which are aligned to the contact pads 40 of the substrate 38. The interconnect protrusions 34 are typically solder bumps which have been formed on the bonding pads 36 on the die surface. Methods of forming $C_4$ solder bumps are well known in the art. The contact pads or fingers 40 have the metal paste 42 already pre-placed thereon. As shown the metal paste is composed of substantially spherical individual nodules 44. These nodules have been partially fused together, at just the tangents of the nodules, to provide a continuous electrical path through the paste 42 down to the contact pad 40 as discussed above.

Then in FIG. 4 the semiconductor die is joined to the nodular paste on the substrate. The joint between the solder bump 34 and the metal paste 42 is effectively a tack joint to provide a temporary attachment between the semiconductor die and the substrate. This joining process is performed through reheating the nodular paste at the predetermined optimum temperature to form a partial liquidus region at the outer skin of the nodules. This liquidus region then joins the solder bump to the paste along a small portion of the bottom of the bump as illustrated by contact area 46.

Once the semiconductor die is attached to the substrate in the above manner, the die can then be tested and burned-in according to specification. A major advantage to the present method of attachment is that no additional positive spring pressure is needed to help maintain continuous contact between the die and the substrate. The physically relatively weak solder joints at the tangent of the solder bump to the underlying paste nodules provide sufficient contact to maintain electrical continuity for testing and burn-in evaluations.

Figure 6:
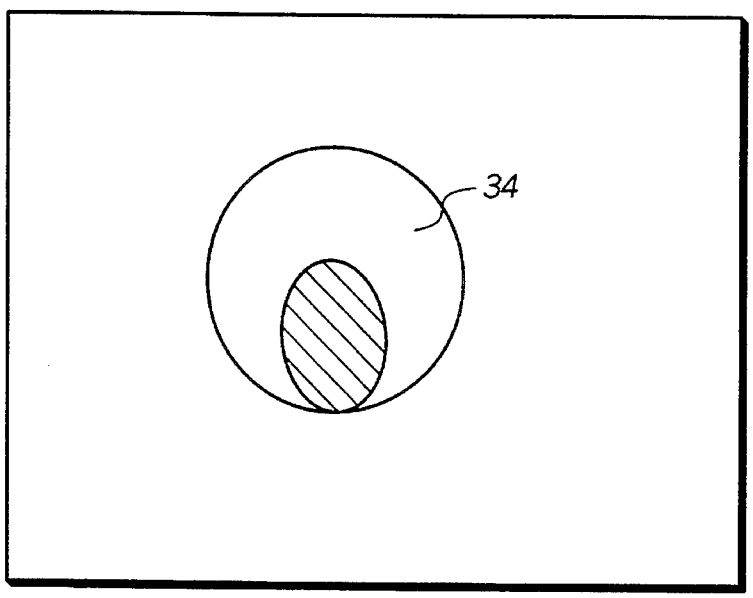
FIG. 6 is a magnified photograph of a solder ball which has been removed from the substrate after being temporarily attached thereto to illustrate the efficacy of the present invention.
Figure 7:
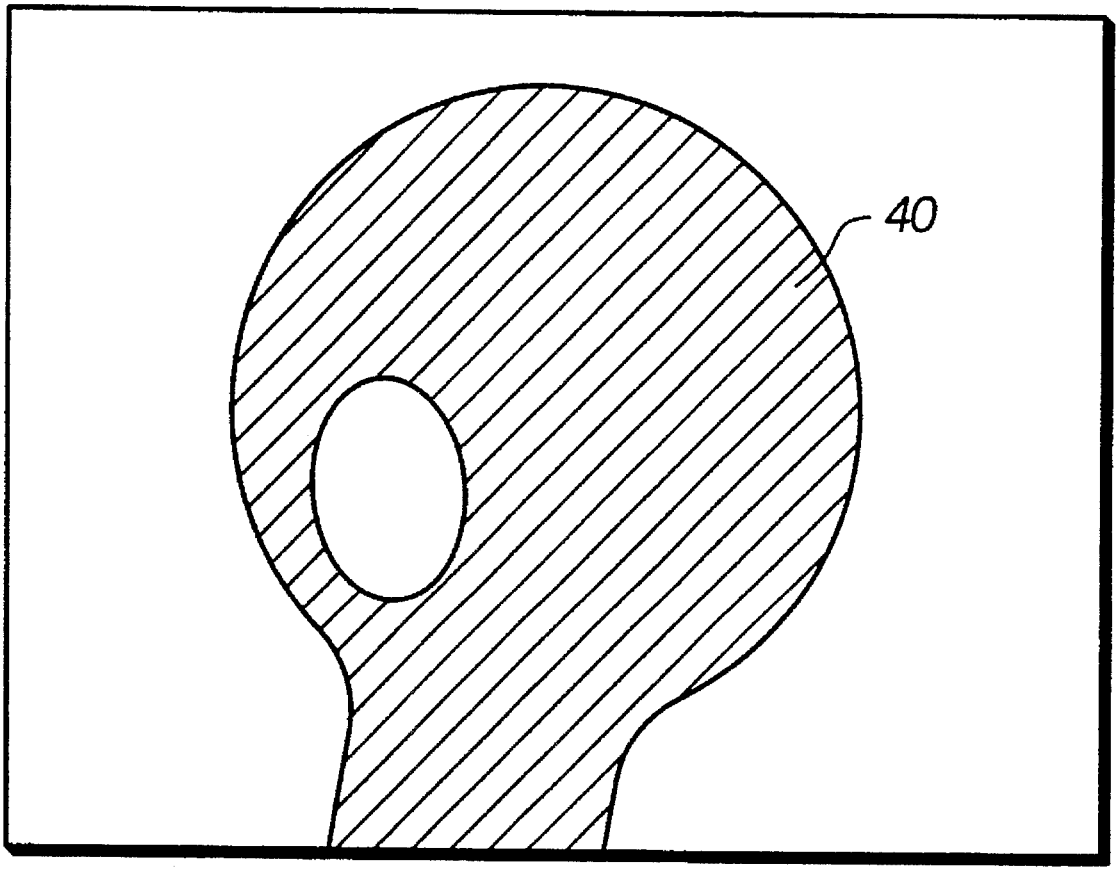
FIG. 7 is a magnified photograph of a contact pad on substrate after the solder ball of FIG. 6 has been removed to illustrate the efficacy of the present invention.

After these evaluations, the tested KGD can be easily removed from the carrier substrate without significant deformation to the solder bump. The removal step is usually performed by the local application of heat, physical application of tensile or shear stress or by local freezing with a gas such as $CO_2$. FIG. 6 is a magnified photograph of a solder ball which has been removed from the test substrate after being temporarily attached thereto in accordance with the above disclosed method. The photograph shows how a small attach cross-sectional area has been achieved using the above-described methodology and how the bump has retained its substantially spherical shape throughout the process. Any solder material remaining on the solder bump can be redistributed onto the bump by an additional low temperature (183° C.– 220° C.) reflow. A high temperature reflow, such as those required in the prior art is not required. FIG. 7 is a magnified photograph of the mating contact pad on substrate after the solder ball of FIG. 6 has been removed. As can be seen the removed solder paste left only a small footprint on the contact pad. This site can be "dressed" to remove excess solder so that the substrate can be reused for testing of another bumped die.

EXPERIMENTAL RESULTS

Several different solder pastes have been used in the reduction to practice of the present invention. The pastes ranged from a eutectic composition of lead-tin (63 wt. % tin, 37 wt. % lead) to an alloy mix of 60% tin and 40% tin. It is important to ensure that the paste nodule size is chosen so that a minimum number of spheres are left on the substrate finger. Using nodule diameters in-the range of 1.0 mil to 1.5 mils (25 to 38 microns) provided the optimized combination of adhesion to 5 mil (127 micron) substrate fingers and a tack joint between the nodules. It was observed that pastes that contain "fines" (very small particle sizes) interspersed into a larger nodule size tend to mat together and are unsuitable for forming successful nodular structures because the "fines" melted and coalesced too quickly as compared to the larger sized nodules. As a practical matter, an acceptable range for the nodule diameter could be between 1 to 4 mils (25 to 100 microns). The upper limit is defined by the size of the contact pad because at least 1 nodule must be on the pad in order for the invention to work.

For the eutectic and 60% tin alloy pastes, a furnace temperature of 183° C. ±1° C. was selected for the solder paste attach step. This operating temperature window was just sufficient to wet the material to the substrate finger without altering the spherical shape of the paste nodules in any significant way. The dwell time of this first partial melting process above the critical phase transition temperature was between 45 and 60 seconds. However, it should be understood that the dwell time is dependent on a given paste metallurgy and the furnace used.

The semiconductor dice used to evaluate the attach process had solder bumps that contained 3% tin. These solder bumps melt at approximately 320° C., as can be seen from the phase diagram 10 in FIG. 1. The bumps were aligned to and placed on the contact pads on the substrate. The substrate and die were then heated to 183° C.±1° C. to effect localized metallurgical joining without full reflow of either the solder bumps or the nodular solder paste.

In all these experiments, the dice were removed from the substrates by gently tensile pulling on the dice after verification of electrical continuity between the dice and substrate. However, other methods of removal, such as the local application of heat, physical application of tensile or shear stress or by local freezing with a gas such as $CO_2$, would probably be used in a manufacturing environment. Additionally, in normal practice these dice would be electrically tested, burned-in and removed for shipment after these operations were completed. If required, the dice could be subjected to an additional low temperature (183° to 220° C.) heat cycle to distribute any low melting material transferred from the paste nodules onto the solder bump.

The foregoing description and illustrations contained herein demonstrate many of the advantages associated with the present invention. In particular, it has been revealed that a temporary electrical joint can be formed between a solder bumped semiconductor die and a substrate carrier by first placing a number of metallic nodules on a substrate finger by carefully heating a pre-applied solder paste to a point where it partially melts, yet retains its spherical shape. Then solder bumps on a C4 die can be aligned to and placed onto these nodules. The contacting bumps and nodules are then reheated to a predetermined lowest melting temperature of the nodules to form a tack joint between the nodules and the bumps. The temporary attachment allows electrical test and burn-in to be performed without requiring any of the mechanical methods such as piercing or abrasive connections and external positive spring forces. By using this technique one can obtain good electrical contact across small cross-sectional interfaces between the solder nodules and the chip solder bump. Since the joint is through a small cross-sectional interface, this interface can be broken very easily after test and burn-in without causing extensive damage to the solder bumps or to the contact pads on the substrate.

Thus it is apparent that there has been provided, in accordance with the invention, a method for forming a temporary attachment between a semiconductor die and a substrate that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is applicable to other solder systems where low melting alloys can be merged with high temperature bump metallurgies to form temporary attachments. These may include indium, bismuth, and gallium based solders. Furthermore, the invention can be extended to nodular deposition methods that use "solder-jet" spraying techniques onto the substrates. These are small droplets of solders that are dispensed from a heated spray gun to form protrusion on a substrate. In addition, the invention is not limited to attaching a die to a test substrate, but can be extended to attaching a die to a product board. The procedure would involve attaching a semiconductor die for the purposes of testing and burn-in. If the die is determined to be electrically good after test, it could be locally heated onto the board to form a permanent connection. On the other hand, if the die failed test, it could be removed and replaced with a fresh die and the test cycle repeated. It is also important to note that the present invention is not limited in any way to attaching a bumped die to any particular type of substrate. For example, the substrate could be either ceramic or an organic printed circuit board. Furthermore, the invention is not limited to any particular type or shape of solder bumps on the semiconductor die. The method of temporary attachment would work equally well for spherical-shaped solder bumps as well as cone-shaped solder bumps. Therefore, it is intended that this invention encompasses all such variations and modifications falling within the scope of the appended claims.

I claim:

1. A method for forming a temporary attachment between a semiconductor die and a substrate, comprising the steps of:

placing a metal paste, composed of substantially spherical metallic nodules, upon a contact pad of the substrate;

partially melting the metal paste at approximately a lowest melting temperature of the metal paste to obtain a first partial liquidus region to partially fuse the spherical metallic nodules together;

aligning an interconnect protrusion on an active surface of the semiconductor die to the contact pad; and reheating the metal paste at approximately a lowest melting temperature of the metal paste to obtain a second partial liquidus region to join the interconnect protrusion to the contact pad with a tack joint to form an electrical contact between the semiconductor die and the contact pad.

2. The method of claim 1, wherein the step of placing the metal paste is performed through screen printing.

3. The method of claim 1, wherein the step of placing a metal paste is performed by dispensing a solder paste composed of 20 wt % to 97 wt % lead.

4. The method of claim 1, wherein the step of partially melting is performed at a temperature substantially in a range of 183° to 250° C.

5. The method of claim 1, wherein the step of aligning the interconnect protrusion comprises aligning a solder bump.

6. The method of claim 1, further comprising the step of:

testing the semiconductor die which is electrically connected to the contact pad on the substrate.

7. The method of claim 6, further comprising the step of:

burning-in the semiconductor die.

8. A method for forming a temporary attachment between a semiconductor die and a substrate, comprising the steps of:

placing a solder paste composed of substantially spherical solder nodules upon a contact pad on the substrate;

partially melting the solder paste at approximately a lowest melting temperature of the solder paste to get a first partial liquidus region between the spherical solder nodules to partially fuse the spherical solder nodules together;

aligning an interconnect protrusion on an active surface of the semiconductor die to the contact pad; and reheating the solder paste at approximately a lowest melting temperature of the solder paste to get a second partial liquidus region to join the interconnect protrusion to the contact pad with a tack joint to form an electrical contact between the semiconductor die and the contact pad.

9. The method of claim 8, wherein the step of placing the solder paste is performed through screen printing.

10. The method of claim 8, wherein the step of placing a solder paste is performed by dispensing a eutectic solder paste composed of substantially 63 wt % tin and 37 wt % lead.

11. The method of claim 8, wherein the step of partially melting is performed at substantially 183° C.

12. The method of claim 8, wherein the step of aligning the interconnect protrusion comprises aligning a solder bump containing 3 wt % tin.

13. The method of claim 8, further comprising the step of:

testing the semiconductor die which is electrically connected to the contact pad on the substrate.

14. The method of claim 13, further comprising the step of:

burning-in the semiconductor die.

15. A method for testing a semiconductor die, comprising the steps of:

providing a test substrate having a pattern of conductive traces terminating in a plurality of contact pads on a surface of the test substrate;

placing a metal paste, composed of substantially spherical metallic nodules, upon a contact pad of the plurality of contact pads;

partially melting the metal paste at approximately a lowest melting temperature of the metal paste to obtain a first partial liquidus region to partially fuse the spherical metallic nodules together;

aligning an interconnect protrusion on an active surface of the semiconductor die to said contact pad having the metal paste thereon;

reheating the metal paste at approximately a lowest melting temperature of the metal paste to obtain a second partial liquidus region to join the interconnect protrusion to the contact pad with a tack joint to form an electrical contact between the semiconductor die and the contact pad; and testing the semiconductor die through contacting the pattern of conductive traces on the test substrate.

16. The method of claim 15, wherein the step of placing the metal paste is performed through screen printing.

17. The method of claim 15, wherein the step of placing a metal paste is performed by dispensing a solder paste having a lead content of 20 wt % to 97 wt %.

18. The method of claim 17, wherein the step of partially melting is performed at a temperature substantially in a range of 183° to 250° C.

19. The method of claim 15, wherein the step of providing a test substrate comprises providing ceramic test substrate.

20. The method of claim 15, wherein the step of providing a test substrate comprises providing printed circuit board test substrate.

\* \* \* \* \*